United States Patent
Oikawa et al.

(10) Patent No.: US 9,937,683 B2
(45) Date of Patent: Apr. 10, 2018

(54) COMPOSITE SHEET, PRODUCTION METHOD THEREOF AND ELECTRONIC APPARATUS USING THE SAME

(71) Applicant: Panasonic Intellectual Property Management Co., Ltd., Osaka (JP)

(72) Inventors: Kazuma Oikawa, Osaka (JP); Kei Toyota, Osaka (JP); Daido Kohmyohji, Nara (JP); Shigeaki Sakatani, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/746,365

(22) Filed: Jun. 22, 2015

(65) Prior Publication Data

US 2016/0016378 A1 Jan. 21, 2016

(30) Foreign Application Priority Data

Jul. 18, 2014 (JP) ................................. 2014-147550
Apr. 6, 2015 (JP) ................................. 2015-077364

(51) Int. Cl.
*B32B 5/18* (2006.01)
*B32B 5/02* (2006.01)
(Continued)

(52) U.S. Cl.
CPC ............. *B32B 5/18* (2013.01); *B29C 65/02* (2013.01); *B29C 66/7294* (2013.01); *B29C 66/73113* (2013.01); *B29C 66/7444* (2013.01); *B32B 5/022* (2013.01); *B32B 5/026* (2013.01); *B32B 5/26* (2013.01); *B32B 7/005* (2013.01); *B32B 7/02* (2013.01); *B32B 7/04* (2013.01); *B32B 9/007* (2013.01); *B32B 9/047* (2013.01); *B32B 17/06* (2013.01); *B32B 37/06* (2013.01);
(Continued)

(58) Field of Classification Search
CPC ........................................................ B32B 9/007
USPC .................................................... 361/679.55
See application file for complete search history.

(56) References Cited

U.S. PATENT DOCUMENTS 4,915,984 A 4/1990 Murakami
6,740,385 B2 * 5/2004 Gardner .................... B32B 5/06
28/107

(Continued)

FOREIGN PATENT DOCUMENTS

JP 61-275116 12/1986
JP 10-126081 5/1998
(Continued)

OTHER PUBLICATIONS

The Extended European Search Report dated Sep. 28, 2015 for the related European Patent Application No. 15171566.1.

*Primary Examiner* — Mukund G Patel
(74) *Attorney, Agent, or Firm* — Panasonic IP Management; Kerry S. Culpepper

(57) ABSTRACT

A composite sheet includes a graphite layer, a heat insulation layer including a fiber and a heat insulation material and a fiber layer located between the graphite layer and the heat insulation layer, wherein the fiber layer comprises the fiber. An electronic apparatus includes an electronic component that involves heat generation, a housing and the composite sheet, wherein the composite sheet is placed between the electronic component and the housing.

17 Claims, 7 Drawing Sheets

(51) Int. Cl.
   *B32B 5/26* (2006.01)
   *B32B 7/00* (2006.01)
   *B32B 7/02* (2006.01)
   *B32B 9/00* (2006.01)
   *B32B 9/04* (2006.01)
   *H01L 23/373* (2006.01)
   *B29C 65/02* (2006.01)
   *B29C 65/00* (2006.01)
   *B32B 7/04* (2006.01)
   *B32B 17/06* (2006.01)
   *B32B 37/06* (2006.01)
   *B32B 37/18* (2006.01)
   *G06F 1/16* (2006.01)
   *H01L 23/36* (2006.01)
   *B29K 707/04* (2006.01)
   *B29L 31/34* (2006.01)

(52) U.S. Cl.
   CPC .......... *B32B 37/182* (2013.01); *G06F 1/1656* (2013.01); *H01L 23/373* (2013.01); *B29K 2707/04* (2013.01); *B29K 2713/00* (2013.01); *B29K 2715/003* (2013.01); *B29L 2031/3481* (2013.01); *B32B 2250/02* (2013.01); *B32B 2250/03* (2013.01); *B32B 2266/0228* (2013.01); *B32B 2266/0278* (2013.01); *B32B 2266/0285* (2013.01); *B32B 2266/04* (2013.01); *B32B 2266/057* (2016.11); *B32B 2266/06* (2013.01); *B32B 2266/102* (2016.11); *B32B 2266/126* (2016.11); *B32B 2305/22* (2013.01); *B32B 2307/302* (2013.01); *B32B 2307/304* (2013.01); *B32B 2307/706* (2013.01); *B32B 2313/04* (2013.01); *B32B 2457/00* (2013.01); *B32B 2457/04* (2013.01); *H01L 23/36* (2013.01); *H01L 2924/0002* (2013.01)

(56) References Cited

U.S. PATENT DOCUMENTS

| | | | |
|---|---|---|---|
| 2004/0076810 A1* | 4/2004 | Blain | B32B 9/00 428/293.4 |
| 2005/0270746 A1* | 12/2005 | Reis | G06F 1/203 361/708 |
| 2011/0011601 A1 | 1/2011 | Ono et al. | |
| 2011/0114342 A1* | 5/2011 | Ono | A62C 2/065 169/45 |
| 2011/0208323 A1* | 8/2011 | Clausen | A61F 2/6607 623/55 |
| 2015/0077957 A1 | 3/2015 | Sakatani et al. | |

FOREIGN PATENT DOCUMENTS

| | | |
|---|---|---|
| JP | 2002-217578 | 8/2002 |
| JP | 2009-111003 | 5/2009 |

* cited by examiner

106

COMPOSITE SHEET, PRODUCTION METHOD THEREOF AND ELECTRONIC APPARATUS USING THE SAME

TECHNICAL FIELD

The technical field relates to a composite sheet, having heat insulation properties and heat radiation properties, which is used inside an electronic apparatus, a production method thereof, and an electronic apparatus using the same. Particularly, the composite sheet relates to a composite sheet in which a heat insulation layer and a heat radiation layer are laminated.

BACKGROUND

In recent years, with technical advancement in performance of electronic apparatuses such as smart phones, tablets and notebook computers, heat generation densities of heat-generating components have rapidly increased, and therefore, heat diffusion techniques have been required for these electronic apparatuses.

Particularly, small-sized mobile apparatuses frequently come into direct contact with the human body, and increases in temperatures of exterior surfaces of their housings have been serious problems. As one problem concerning increases in temperatures of exterior surfaces of the housings of the mobile apparatuses, low temperature burn injuries can be mentioned. Low temperature burn injuries are a type of burn caused by long-term exposure of the human body to a temperature higher than the body temperature. There has been a report that, when the temperature is 44° C., burn injuries will occur in 6 hours, and that the time required to result in burn injuries will be shortened to half by an increase of 1° C. Compared with usual burn injuries, in most cases of low temperature burn injuries, injured persons take long to notice the progression of the symptoms. When the injured persons eventually notice the injuries, there are many cases that they already have serious skin injuries.

Moreover, liquid crystal or organic EL displays are used for display elements of mobile apparatuses. However, since these display elements are weak to heat, and, if heat from heat-generating components transmits to the display elements, this becomes a factor that causes uneven brightness or reduced durable life of the displays. Therefore, in order to satisfy both of high performance and reduced size/thickness of mobile apparatuses, it is required that the heat transmission to display elements is effectively reduced.

Furthermore, recently, there are many cases where low temperature burn injuries occur when small-sized notebook computers are used on the knee for a long time. In a state where downsizing of apparatuses and development of their mobile forms will be increasingly progressed in the day ahead, the most important issue to keep the temperature of the surface of the apparatuses as low as possible even by 1° C.

Meanwhile, as for a method for preventing an increase in the surface temperature of an apparatus, use of a heat insulation member can be considered in order to prevent heat from a heat generating component inside a housing of the apparatus from transmitting to the housing. For example, an attempt to reduce heat transmission to the housing, thereby averaging a temperature distribution of the inside of the housing has been made by providing a heat insulation member made of a composite of a rubber and a foam product inside the housing of the apparatus (JP-A-2002-217578).

As an alternative method, a method in which a heat conductive sheet obtained by adding a heat conductive filler to a resin, a metal foil such as aluminum foil, or the like is attached to the inner surface of the housing to lower a surface temperature of the apparatus based on heat diffusion can also be considered. In addition, a heat radiation sheet such as a graphite sheet has been used as a heat diffusion material in mobile apparatuses that require downsizing and weight reduction (JP-A-61-275116). A graphite sheet has a high heat conductivity in the surface direction, and mitigates heat spots caused on surfaces of apparatuses, consequently causing effects to lower surface temperatures of the apparatuses.

Moreover, in order to protect heat-sensitive components such as electrolytic capacitors, ICs, CPUs and optical components, a method in which a composite material having a metal film laminated on one surface of a highly-oriented graphite sheet and having a heat insulation material on the other surface is disposed between a heat-generating component and a heat-sensitive component has been known (JP-A-10-126081). In this case, the composite material is disposed therein such that the metal film is allowed to face the heat generating component, and that the heat insulation material is allowed to face the heat-sensitive component. The metal film acts to reflect the heat from the heat-generating component, and the heat insulation material acts to protect the heat-sensitive component. An aluminum foil is used as the metal film, and a ceramic or resin sheet is used as the heat insulation material.

Furthermore, as an example of a method for combining a graphite sheet and a heat insulation material, a combining method that uses an intermediate of an acrylic, silicone, epoxy or polyimide resin-based adhesive layer as an adhesive material has been known (JP-A-2009-111003). When silica aerogel is used as the heat insulation material in this method, there are cases where the resin adhesive layer intrudes into pores on a scale of several tens of nanometers present in the silica aerogel, and this results in deterioration of original heat-insulating performance of the silica aerogel.

SUMMARY

When only a heat insulation material is used inside a housing of an electronic apparatus, there are limitations to effects to reduce heat transmission to the housing. However, this problem can be solved by increasing the thickness of the attached heat insulation material.

Nevertheless, in recent years, miniaturization of apparatuses has progressed to the point at which there are almost no spaces inside housings in which a thick heat insulation material can be included.

Furthermore, when heat insulation properties of the heat insulation material are excessively enhanced, the heat is accumulated inside the housings, and the internal temperature and the housing temperature become high, possibly causing deformation in a case where the heat insulation material is a foamed resin.

When only a heat conductive sheet is used inside a housing of an electronic apparatus, a heat conductive composite sheet including a resin and a heat conductive filler, or a metal foil such as an aluminum or copper foil is used as the heat conductive sheet.

When only a heat conductive sheet is attached to the inner surface of the housing, the thickness of the sheet is small (0.05 to 2 mm), and its heat conductivity is higher than that of the resin. Therefore, the heat more easily transmits in the thickness direction before the heat spreads to the surface direction. In consequence, the housing becomes hot. In addition, in the same manner as a heat conductive sheet, the heat conductivity in the surface direction is not sufficiently large, as compared with the heat conductivity in the thickness direction.

In other words, when there is no anisotropy in the heat conductivity in the surface direction and the heat conductivity in the thickness direction, a heat diffusion effect to the surface direction will not occur, and sufficient heat-insulating effects cannot be obtained. In case of a heat conductive sheet, its heat conductivity is about 0.5 to 10 W/m·K, the anisotropy concerning the surface direction and the thickness direction is small, and the composite sheet is soft, thus exhibiting superior adhesion. Therefore, such a composite sheet makes it easier to transmit the heat in the thickness direction. As a result, a heat conductive sheet easily transmits the heat to the housing.

In addition, since metal foils have a quite high heat conductivity of 100 W/m·K or more, they easily convey the heat to the housing before conveying the heat in the surface direction.

When only a graphite sheet is used in a housing of an electronic apparatus, the heat conductivity of the surface direction of the graphite sheet is higher than its heat conductivity in the thickness direction, and there is a 10-fold or even higher anisotropy. Therefore, heat diffusion to the surface direction can be expected. However, since even the thickness of the graphite sheet is small (300 μm or less), the heat transmits to the thickness direction, and the temperature of the housing is likely to increase.

When the composite heat insulation product of the heat insulation material/graphite sheet(/metal film) in JP-A-10-126081 is used inside a housing of an electronic apparatus, a ceramic sheet with a thickness of 0.25 mm or a polyimide film with a thickness of 0.075 mm is used as the heat insulation material, as disclosed in Embodiments 1 and 3 of the document.

However, the ceramic sheet has a higher heat conductivity as compared with resins, and therefore, it cannot be considered that the ceramic sheet severs as a sufficient heat insulation material. Also, since the polyimide film with a thickness of 0.075 mm is thin, the film easily transmits the heat to the housing, and its heat-insulating performance is insufficient.

Further, since the heat-insulating effect is insufficient, the heat insulation material requires heat resistance. It is required to use a heat-resistant material such as a ceramic or polyimide as a heat insulation material. Furthermore, even when an insulation layer is coated onto the inner surface of the housing, or a resin film is attached thereto, the thickness of the formed insulation layer is small, and its heat insulation properties are insufficient.

In view of the above-described state of the conventional arts, a composite sheet is provided that can bring about sufficient heat-insulating effects even in a narrow space inside a housing of an electronic apparatus, thereby effectively reducing heat transmission from a heat-generating component to the housing, as well as a production method of the same and an electronic apparatus including the same.

In order to solve the above-described problem, a composite sheet including: a graphite layer; a heat insulation layer including a fiber and a heat insulation material; and a fiber layer located between the graphite layer and the heat insulation layer, wherein the fiber layer includes the fiber, is provided.

Furthermore, a method of producing the composite sheet, including: overlapping the graphite layer and the heat insulation layer; then heating a side of the graphite layer to melt the fiber in the heat insulation layer that is present in a boundary face between the graphite layer and the heat insulation layer; and cooling the fiber to laminate the graphite layer and the heat insulation layer is provided.

An electronic apparatus including: an electronic component that involves heat generation; a housing; and the above composite sheet, wherein the composite sheet is placed between the electronic component and the housing, is provided.

Accordingly, a composite sheet that can bring about sufficient heat-insulating effects even in a narrow space inside the housing of the electronic apparatus, thereby effectively reducing heat transmission from a heat-generating component to the housing, as well as a production method thereof, and an electronic apparatus including the composite sheet can be provided.

DESCRIPTION OF EMBODIMENTS

First Embodiment

Figure 1:
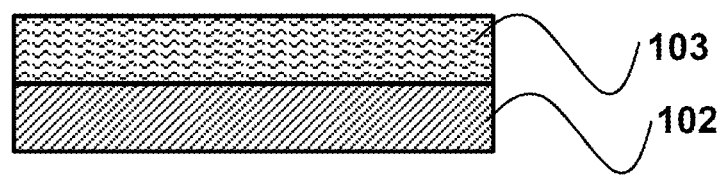
FIG. 1 is a cross-section view of a composite sheet according to an embodiment.

A composite sheet of the embodiment includes a graphite layer and a heat insulation layer. Its cross-section is shown in FIG. 1. The composite sheet is a laminate of a graphite layer 102 and a heat insulation layer 103.

<Heat Conductivity in the Surface Direction of the Graphite Layer 102>

The graphite layer 102 used herein preferably has a heat conductivity in the surface direction of 1,000 W/m·K or more.

When the heat conductivity is less than 1,000 W/m·K, sufficient heat diffusion to the surface direction will not occur, and the heat will transmit to the thickness direction. In addition, the heat conductivity of the graphite layer 102 can be calculated based on the following formula (1).

$$\lambda = \alpha \times d \times Cp \tag{1}$$

In the formula, $\lambda$ represents a heat conductivity, $\alpha$ represents a heat diffusivity, d represents a density, and Cp represents a specific heat capacity.

<Heat Conductivity in the Thickness Direction of the Graphite Layer 102>

A heat conductivity in the thickness direction of the graphite layer 102 depends on a thickness of the graphite layer 102 used herein. To effectively diffuse the heat from a heat source to the in-plane direction, the heat conductivity in the thickness direction of the graphite layer 102 is preferably 20 W/m·K or less when the thickness of the graphite layer 102 is 100 μm or less.

When the heat conductivity in the thickness direction of the graphite layer 102 is larger than 20 W/m·K, effects to diffuse the heat from the heat-generating component into the plane will be weak, and the heat will transmit to the side of the housing.

In addition, the heat conductivity in the thickness direction of the graphite layer 102 is preferably 18 W/m·K or less when the thickness of the graphite layer 102 is 80 μm or less. When the heat conductivity of the graphite layer 102 is larger than 18 W/m·K, effects to diffuse the heat from the heat-generating component into the plane will be weak, and the heat will transmit to the side of the housing.

On the other hand, when the heat conductivity in the thickness direction of the graphite layer 102 is 15 W/m·K or less, much of the heat from the heat-generating component will not be transmitted in the thickness direction. In addition, a rate of diffusion of the heat from the heat-generating component to the surface direction will be larger, and therefore, such a range is preferable.

<Thickness of the Graphite Layer 102>

The thickness of the graphite layer 102 used herein is preferably 0.1 mm or less in terms of a space.

Thicknesses of recent electronic apparatuses have progressively been reduced, and spaces inside housings of the apparatuses in which components are installed have become very narrow. Therefore, it is difficult to incorporate a film with a thickness of 0.1 mm or more inside the housings of the apparatuses.

<Method for Producing the Graphite Layer 102>

For the graphite layer 102, the following graphite sheets are available. For the graphite sheet, a polymer film having a thickness within a range of 1 μm to 400 μm, selected from among an aromatic polyimide, an aromatic polyamide and a polyoxadiazole, is used. The polymer film is subjected to a heat treatment within a range of 450° C. to 2,000° C., and thus, is converted to a carbonaceous film. Then, a plurality of the carbonaceous films are overlapped. Then, the overlapped carbonaceous films are subjected to hot pressing to produce a graphite sheet.

Hot pressing includes a step in which a pressure of 20 kg/cm$^2$ or less is applied thereto at 2,800° C. or less; and a second hot pressing step in which a pressure higher than 20 kg/cm$^2$ is applied thereto at a temperature higher than 2,800° C.

<Heat Conductivity of the Heat Insulation Layer 103>

A heat conductivity of the heat insulation layer 103 used in this embodiment is within a range of 0.01 to 0.1 W/m·K.

The heat conductivity is preferably within a range of 0.01 to 0.05 W/m·K for the use in a space of 0.5 mm or less.

In addition, the heat conductivity is more preferably within a range of 0.01 to 0.03 W/m·K for the use in a space of 0.3 mm or less.

The lower the heat conductivity of the heat insulation layer 103 is, the higher its heat-insulating effect is. As the heat conductivity of the heat insulation layer 103 is lower, a smaller thickness of the heat insulation layer 103 will be sufficient to obtain the same heat-insulating effect. This is preferable when the heat insulation layer 103 is used in a narrower space.

On the other hand, when the heat conductivity is larger than 0.1 W/m·K, the heat-insulating effect decreases, and the thickness of the heat insulation layer 103 needs to be increased in order to obtain a required heat-insulating effect. Therefore, this is not preferable.

<Thickness of the Heat Insulation Layer 103>

The thickness of the heat insulation layer 103 is within a range of 0.05 mm to 1 mm, and is preferably within a range of 0.05 mm to 0.2 mm.

When the thickness of the heat insulation layer 103 is smaller than 0.05 mm, the heat-insulating effect in the thickness direction is lowered, and therefore, it is required that a low heat conductive material exhibiting a significantly low heat conductivity is selected. However, such a material does not exist. Consequently, in this case, heat transmission in the thickness direction from one surface to the other surface cannot sufficiently be reduced.

On the other hand, when the thickness of the heat insulation layer 103 is larger than 1 mm, it becomes difficult to incorporate the composite sheet into a thin apparatus, as mentioned with regard to the thickness of the graphite layer 102.

With regard to mobile apparatuses such as smartphones and tablets, when the thickness of the heat insulation layer 103 is larger than 0.2 mm, it becomes more difficult to incorporate the composite sheet to the apparatuses, in view of the final thickness after the heat insulation layer 103 is combined with the graphite layer 102.

<Material for the Heat Insulation Layer 103>

As materials for the heat insulation layer 103, inorganic fiber-based glass wool or rock wool, natural sheep wool or cellulose heat insulation materials, foaming ceramics, carbonized foaming corks, resin-based heat insulation materials such as a urethane foam, phenol foam and polystyrene foam, and the like can be used.

Among them, resin-based heat insulation materials are preferable since they exhibit superior adhesiveness against graphite and adhesive materials, and further have easiness in processing.

In addition, the lower the heat conductivity of the heat insulation layer 103 is, the higher the heat-insulating effect obtained by combining the graphite layer 102 and the heat insulation layer 103 with each other will be. As shown above, the heat conductivity of the heat insulation layer 103 is preferably about 0.01 to 0.05 W/m·K. Specifically, a silica aerogel sheet (0.018 to 0.024 W/m·K), which is obtained by impregnating a nonwoven fabric with silica aerogel having a nanosized void structure that confines motion of air molecules, is preferably used.

<Silica Aerogel Sheet as a Heat Insulation Layer>

A silica aerogel sheet according to the embodiment is a heat insulation sheet obtained by combining silica aerogel having a nanosized porous structure with a nonwoven fabric with a thickness of 0.05 to 1.0 mm. Its heat conductivity is 0.015 to 0.024 W/m·K.

In general, a heat conductivity of a nonwoven fabric is 0.030 to 0.060 W/m·K, and the value is regarded as almost a sum of solid heat conductive components of fibers of the nonwoven fabric and heat conductive components of the air (nitrogen molecules) present in voids of the nonwoven fabric. By combining silica aerogel, which is a low heat conductive material, in the voids, the above-described low heat conductivity can be realized.

The heat conductivity of still air at normal temperature is around 0.026 W/m·K, and the heat conductivity of the nonwoven fabric is larger than this value of the still air. One characteristic of silica aerogel sheets is that they are only heat insulation sheets whose heat conductivities are smaller than that of the still air. Silica aerogel sheets have water repellency and sound absorbability besides heat insulation properties, and flame retardance or heat resistance can also be imparted thereto by selecting a type of nonwoven fabric (e.g., inorganic fibers such as glass wool or rock wool).

<Method for Producing a Silica Aerogel Sheet>

One example of the method for producing a silica aerogel sheet is shown below.

(1) Mixing raw materials: 1.4 wt % of concentrated hydrochloric acid (12 N) as a catalyst is added to high molar ratio sodium silicate (silicate aqueous solution, Si concentration: 14%), and the resulting mixture is stirred to prepare a sol solution.

(2) Impregnation: the sol solution is poured into a nonwoven fabric (material: PET; thickness specification: 90 μm; weight per area: 12 g/m$^2$; dimension: 12 cm square), and the sol solution was pushed and impregnated into the nonwoven fabric using a hand roll.

(3) The nonwoven fabric which has been impregnated with the sol solution is placed between PP films (thickness: 50 μm; 2 pieces; dimension: B6), and this is allowed to stand at room temperature (23° C.) for 20 minutes to convert the sol to gel.

(4) Thickness control: after gelation is confirmed, the impregnated nonwoven fabric with the films is passed through rollers of two shafts where the gap is set to 190 μm (including the film thickness), thereby squeezing excess gel from the nonwoven fabric, and thus, the thickness is controlled to a target of 100 μm.

(5) Curing: the gel sheet with films is put into a container, pure water is poured thereto to prevent dryness, and this is allowed to stand in an incubator at 80° C. for 12 hours to grow silica particles (by a silanol dehydration condensation reaction), thereby forming a porous structure therein.

(6) Film removal: the sheet is taken out of the curing container, and the films are removed therefrom.

(7) First hydrophobizing (hydrochloric acid immersion step): the gel sheet is immersed in hydrochloric acid (6 to 12 N), and then, the gel sheet is allowed to stand at ordinary temperature (23° C.) for 1 hour to introduce hydrochloric acid into the gel sheet.

(8) Second hydrophobizing (siloxane treatment step): the gel sheet is immersed, for example, in a mixture solution of octamethyltrisiloxane, which is a silylating agent, and 2-propanol (IPA), and this is allowed to stand in an incubator at 55° C. to react it for 2 hours. When trimethylsiloxane bonds start to form, aqueous hydrochloric acid is released from the gel sheet, and two-liquid separation (siloxane in the upper layer and aqueous hydrochloric acid in the lower layer) occurs.

(9) Drying: the gel sheet is transferred to an incubator at 150° C., and is dried therein for 2 hours.

<Method for Combining the Heat Insulation Layer 103 and the Graphite Layer 102>

As an example of a method for combining the heat insulation layer 103 and the graphite layer 102, combination thereof through an adhesive layer can be considered. As materials for the adhesive layer, acrylic, silicone, epoxy or polyimide resins can be employed. Basically, the adhesive layer is preferably thinner in order to adapt it to the use in a narrower space.

In addition, as to a combining technique, the above-described silica aerogel sheet and graphite layer 102 are overlapped with each other, and the side of the graphite layer 102 is heated to 200° C. or higher (in a state where both of them are in contact with each other at the boundary face).

Based on this technique, the silica aerogel sheet and the graphite layer 102 can be bound and combined with one another by melting fibers (PET or the like) of the nonwoven fabric on the surface of the aerogel sheet that exist at the boundary face, followed by cooling of the fibers (i.e. by fusion). According to this technique, they can be combined with one another even without an adhesive layer such as an acrylic, silicone or epoxy adhesive layer. That is, they can be bound to one another without using any adhesives.

As for materials for fibers of the nonwoven fabric, thermoplastic resins are preferred. In terms of heat resistance, chemical resistance and dimension stability, PET or PPS (polyphenylene sulfide) is preferable.

The fiber diameter of fibers of the nonwoven fabric is preferably smaller, because such a smaller diameter will reduce the heat conductance through the fibers. The fiber diameter is preferably 0.1 to 30 μm.

The nonwoven fabric can retain the silica aerogel as long as the bulk density of fibers of the nonwoven fabric is 0.5 g/m$^3$ or less. Furthermore, even a larger amount of the silica aerogel can be retained therein when the bulk density is 0.4 g/m$^3$ or less.

Overall, this leads to a reduction of several ten microns in the film thickness. To the contrary, when an adhesive layer (adhesive) is used, the adhesive layer intrudes into pores of several ten nanometers of silica aerogel having a porous structure, and this results in an increase in an amount of solid heat conductive components. That is, this results in inferior heat-insulating performance.

Therefore, such achievement of the combination without using any adhesives features that original heat-insulating performance of silica aerogel will not be deteriorated. As for a technique for heating the graphite layer 102 for the combination, general heating techniques such as hot pressing, use of an infrared heater and microwave irradiation can be used.

Junction between the graphite layer 102 and the aerogel sheet (including fibers of nonwoven fabric), which serves as the heat insulation layer 103, without use of adhesives, will be described with reference to cross-section views of FIGS. 2A to 2D.

Figure 2A:
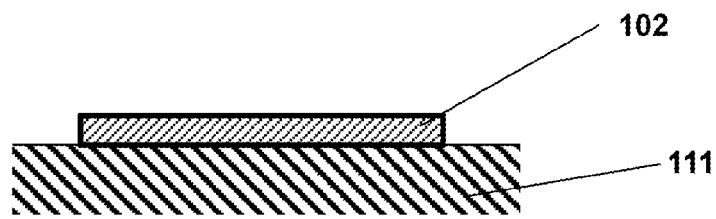
FIGS. 2A to 2D are cross-section views that illustrate a process for joining a graphite layer and a heat insulation layer according to an embodiment.

In FIG. 2A, the graphite layer 102 is set on a hot plate 111. The hot plate 111 is set to 200° C.

Figure 2B:
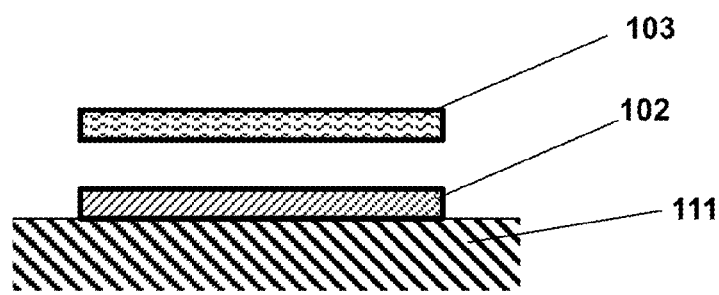

Then, as shown in FIG. 2B, the aerogel sheet (including fibers of nonwoven fabric) that serves as the heat insulation layer 103 is placed on the top surface of the graphite layer 102.

Figure 2C:
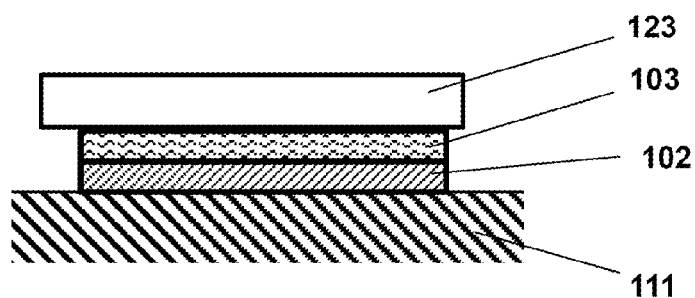

Then, as shown in FIG. 2C, a pressure is applied onto the heat insulation layer 103 with a pressurizer 123.

Figure 2D:
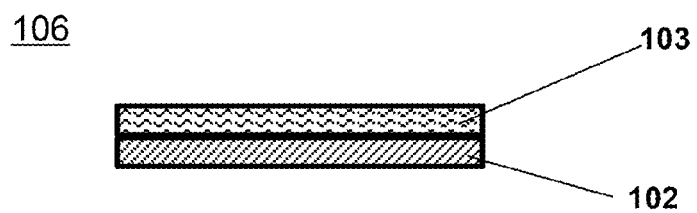

Finally, as shown in FIG. 2D, a laminate of the graphite layer 102 and the heat insulation layer 103 is cooled. Consequently, a composite sheet 106 is produced.

Figure 3A:
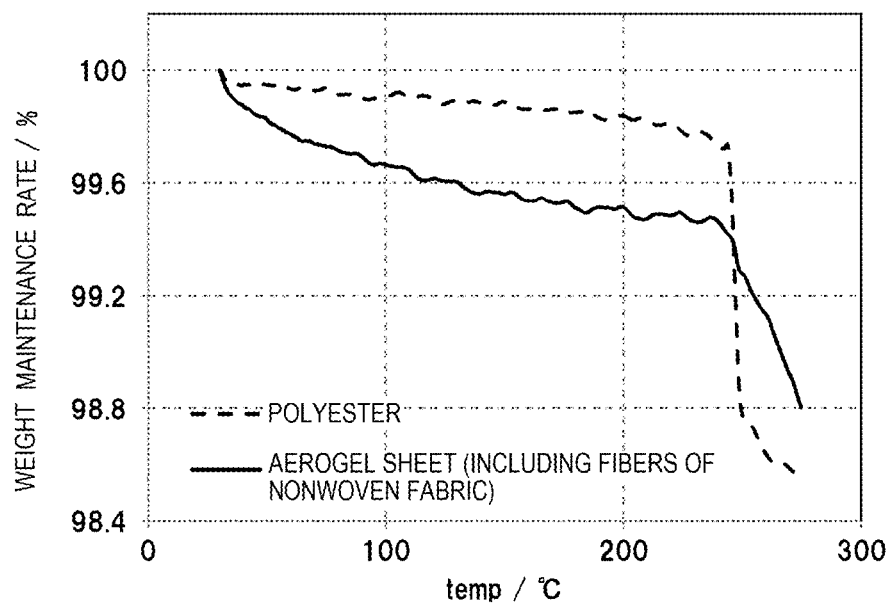
FIGS. 3A and 3B are diagrams that show thermal properties of a material used as a heat insulation material in an embodiment.
Figure 3B:
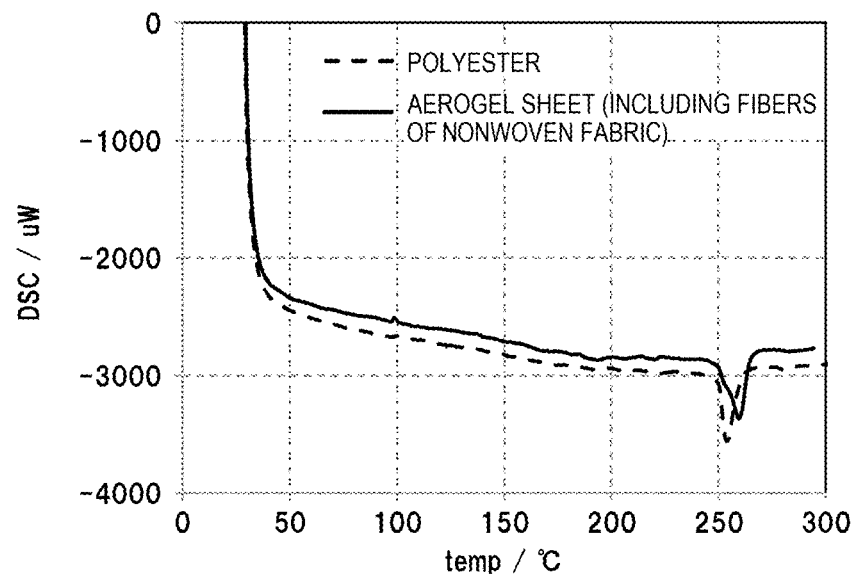

In the above-described example, polyester was used for fibers of the nonwoven fabric. For heat properties of polyester and the aerogel sheet (including fibers of the nonwoven fabric), an analysis based on TG (Thermogravimetry) and DSC (Differential Scanning calorimetery) was conducted. FIG. 3A shows results of the TG. FIG. 3B shows results of the DSC.

In both of FIGS. 3A and 3B, the physical properties significantly change at around 240° C. This is because a state change (melting) occurred.

In the above-described process, the product is not heated to 240° C., and is heated to 200° C. to less than 240° C.

When it is heated to 240° C. or higher, the fibers are completely molten, and cannot be controlled. It is heated to a temperature lower than the temperature, where melting occurs, by 10° C. to 40° C.

Figure 4A:
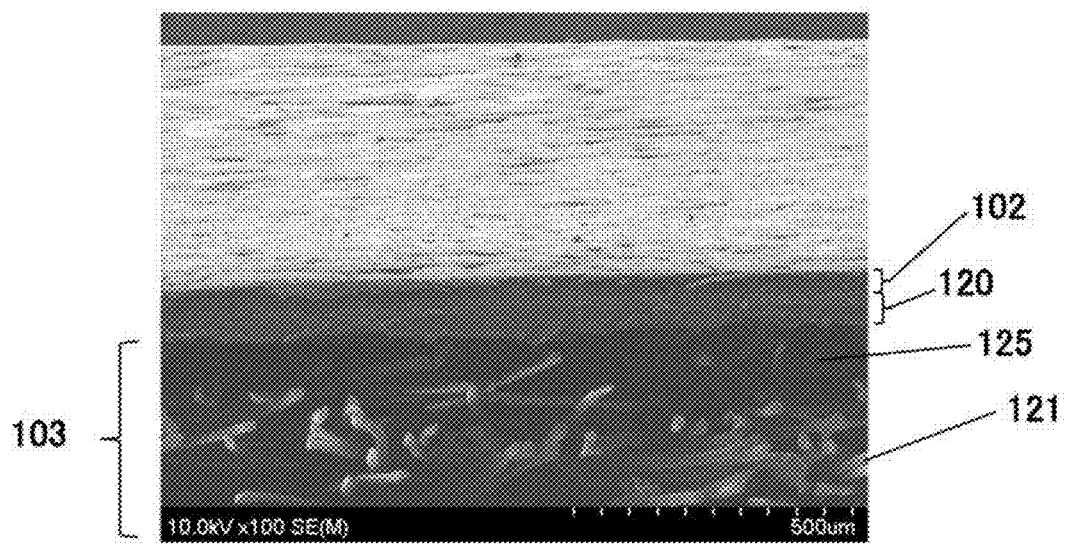
FIGS. 4A and 4B are photos of a boundary face between a graphite layer and a heat insulation layer in an embodiment.
Figure 4B:

Cross-section photos of the produced composite sheet 106 are shown in FIGS. 4A and 4B. FIG. 4A shows a cross-section photo thereof magnified 100 times. FIG. 4B is a cross-section photo thereof magnified 200 times.

A molten layer 120 is generated on the surface of the graphite layer 102. Fibers 121 are joined to the molten layer 120. Silica aerogel 125 is present around the fibers 121.

FIGS. 5A to 5D schematically show the above-described phenomenon. It varies with applied heat and pressure from FIGS. 5A and 5C to FIGS. 5B and 5D.

Figure 5A:
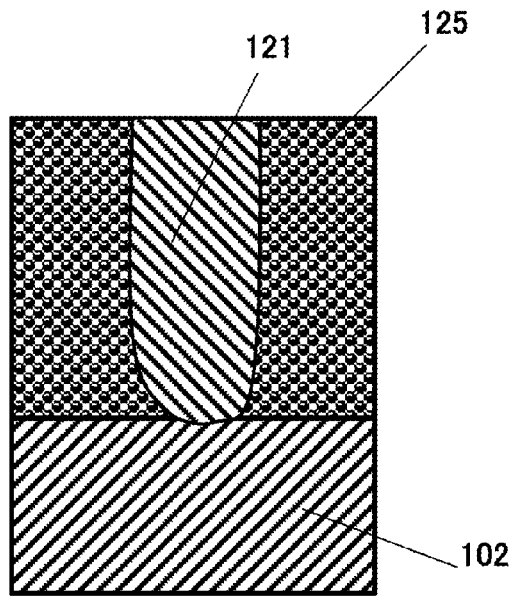
FIGS. 5A to 5D are enlarged cross-section views that illustrate a process for joining a graphite layer and a heat insulation layer according to an embodiment.
Figure 5B:
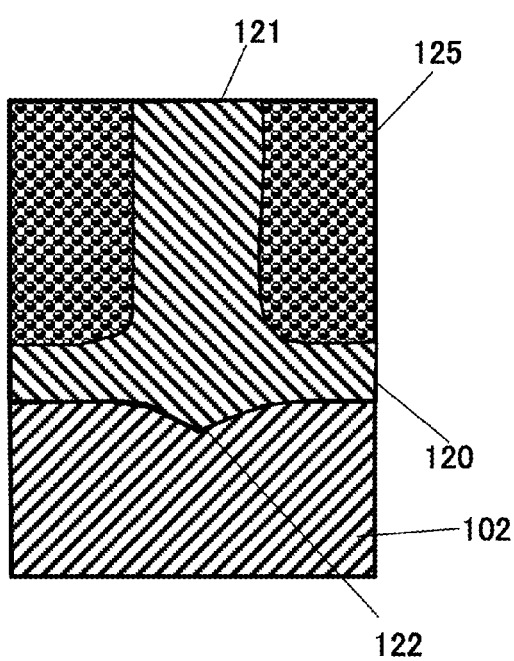
Figure 5C:
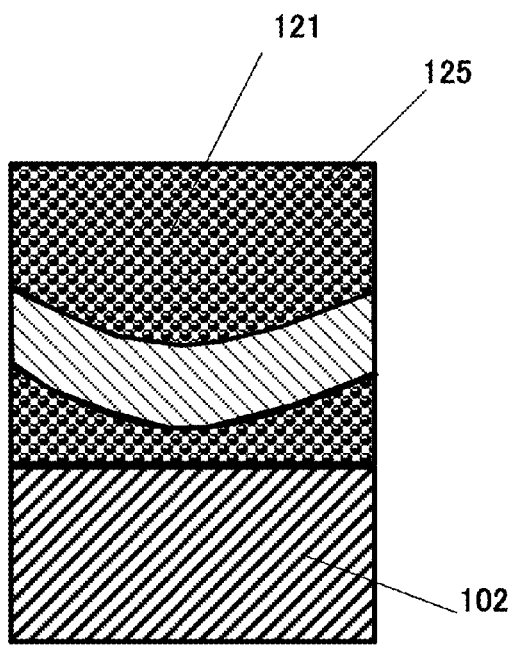
Figure 5D:
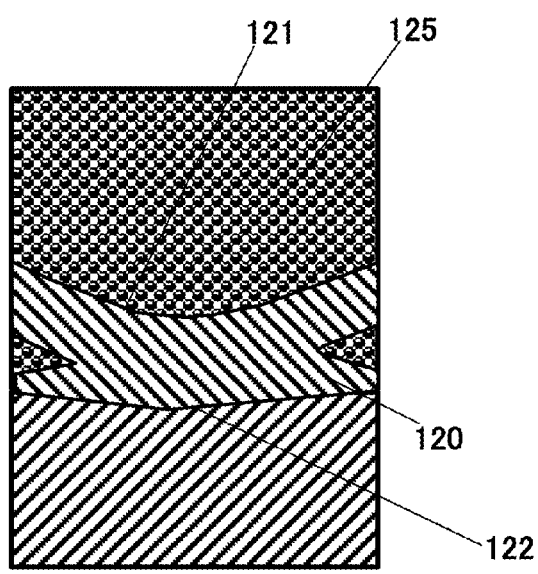

FIG. 5A shows an acuate portion of the tip of a fiber 121, and FIG. 5C shows a round portion of the middle part of the fiber. In both the figures, a molten layer 120 is formed on the surface of the graphite layer 102. The fiber 121 continuously extends from the molten layer 120. Furthermore, a recessed portion 122 is present in the graphite layer 102, and the molten layer 120 penetrates into the graphite layer 102 there. Thus, both the layers are bound to one another.

In addition, instead of the fiber 121, a resin may be allowed to homogenously penetrate into the silica aerogel sheet, and the resin may be molten to join the silica aerogel sheet to the graphite layer 102.

When the silica aerogel sheet that serves as the heat insulation layer 103 is combined with the graphite layer 102, the sizes of them are preferably the same. However, depending on a place where they are located, the size of the heat insulation layer 103 may be made larger than the graphite layer 102, or, to the contrary, the size of the graphite layer 102 may be made larger than the heat insulation layer 103.

Second Embodiment

In the second embodiment, the composite sheet 106 according to the first embodiment may be further coated. Alternatively, the second embodiment includes a composite sheet obtained by attaching another sheet to the composite sheet 106. Matters not mentioned in the second embodiment are the same as the first embodiment.
<Insulation Film>

Since a graphite layer 102 has electric conductivity, a short circuit due to contact with an electronic component may occur when it is used inside an electronic apparatus. Therefore, it is preferable that an insulation film be provided on the surface of the graphite layer 102.

Even when the graphite layer 102 does not come into contact with any electronic components, it is preferable that an insulation film is provided on the surface of the graphite layer 102, in cases where a configuration in which the graphite layer 102 is exposed inside the apparatus is adopted.

For the insulation film, a tape obtained by forming an acrylic, silicone, epoxy or polyimide adhesive or bonding material on one side of a film such as polyimide (PI), polyethylene terephthalate (PET), polyethylene (PE), polypropylene (PP) or polyester is preferable.

Furthermore, hot-melt type (thermoplastic) tapes such as polyester-based products may also be used.

In addition, a method in which the graphite layer 102 is coated with epoxy or phenol, or rubber-based coatings may be adopted.

Figure 6:
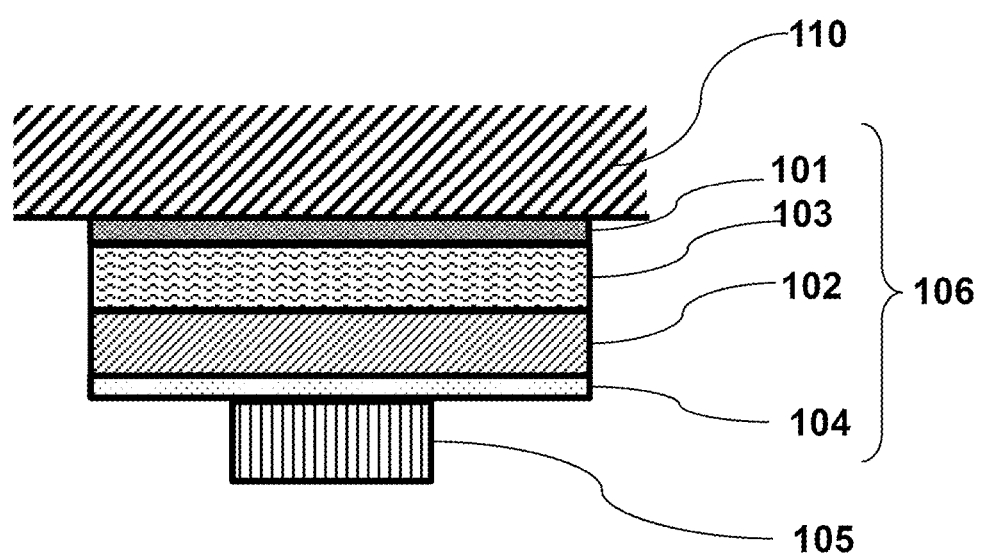
FIG. 6 is a cross-section view of a composite sheet according to an embodiment.

A cross-section view of an example in which the composite sheet 106 is applied to an electronic component is shown in FIG. 6. Insulation films 101 and 104 are placed at both sides of the composite sheet 106. The composite sheet 106 is placed between a heat-generating component 105 and a housing 110 of the apparatus.

Since the graphite layer 102 exists between the heat-generating component 105 and the heat insulation layer 103, heat transmission from the heat-generating component 105 can effectively be diffused to the surface direction, thereby lowering the peak temperature. Since the heat insulation layer 103 exists between the housing 110 and the graphite layer 102, heat transmission to the housing 110 can be prevented.

From the side of the heat-generating component 105, lamination of an insulation film 104, a graphite layer 102, and a heat insulation layer 103 in that order is preferred. In addition, it is preferable that an insulation film 101 is placed at the side of the housing 110. Based on the insulation film 101, dust generation from the heat insulation layer 103 can also be prevented.

In addition, when a double-faced adhesive tape is used for the insulation film 104, the insulation film can easily be adhered to the heat-generating component 105, and therefore, such a double-faced adhesive tape is preferable.

Figure 7:
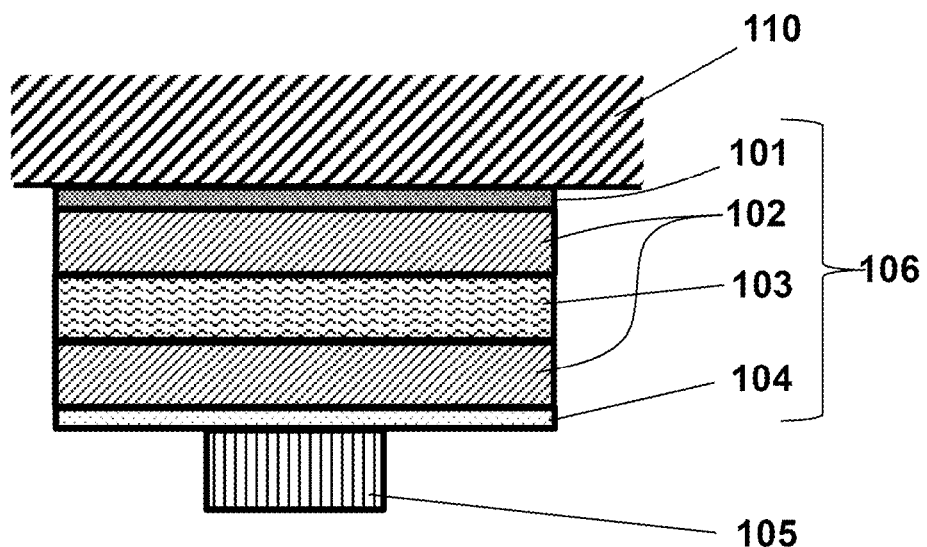
FIG. 7 is a cross-section view of a composite sheet according to an embodiment.

A cross-section view of another variation example is shown in FIG. 7. From the side of a heat-generating component 105, a laminate of an insulation film 104, a graphite layer 102, a heat insulation layer 103 and a graphite layer 102 in that order is adopted therein.

Figure 8:
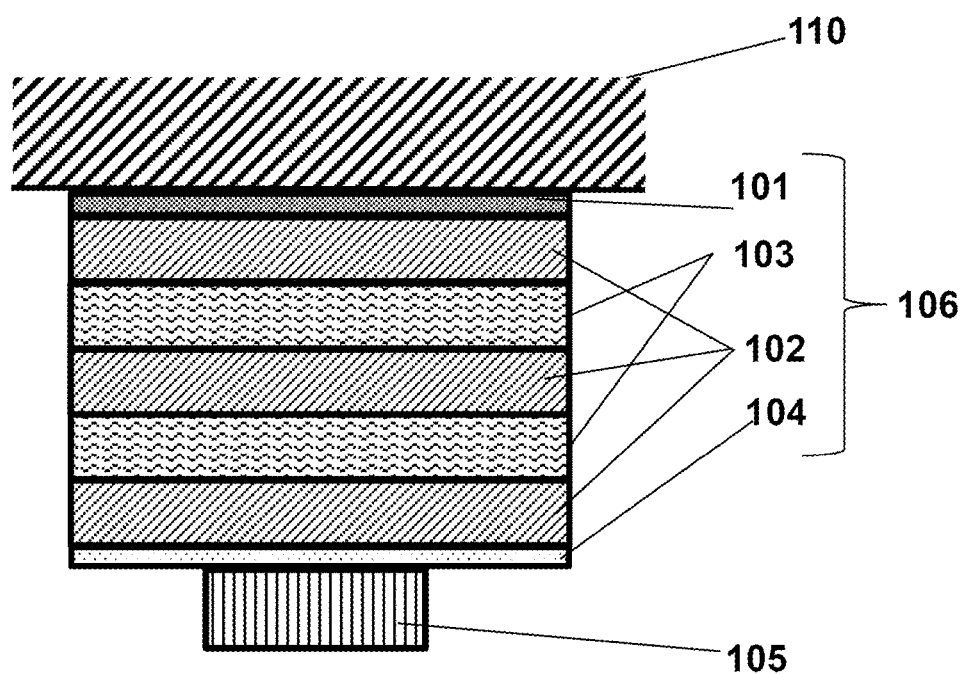
FIG. 8 is a cross-section view of a composite sheet according to an embodiment.

Further, a cross-section view of still another variation example is shown in FIG. 8. From the side of a heat-generating component 105, a laminate unit of a graphite layer 102 and a heat insulation layer 103 is laminated repeatedly through an insulation film 104 as many times as possible.

According to the repeated lamination of the graphite layer 102 and the heat insulation layer 103, heat can be more efficiently homogenized. Provided that the composite sheets 106 in FIGS. 6 to 8 have the same thickness, the composite sheet of FIG. 8 can more effectively insulate the heat.
<Distance Between the Heat-Generating Component 105 and the Composite Sheet 106>

With regard to a distance between the heat-generating component 105 and the composite sheet 106, the heat-generating component 105 and the graphite layer 102 may come into contact with each other. However, the peak temperature becomes higher when they are in contact with each other. Therefore, it is preferable that the heat-generating component 105 and the composite sheet 106 are not in contact with each other.

CONCLUSION AND ADVANTAGES

The composite sheet 106 includes a graphite layer 102 having a thickness of 100 μm or less, a heat conductivity in the surface direction of 1,000 W/m·K or more, and a heat conductivity in the thickness direction of 20 W/m·K or less; and a heat insulation layer 103 having a thickness within a range of 0.05 mm to 1 mm and a heat conductivity within a range of 0.01 to 0.05 W/m·K.

Furthermore, as for a method for combining the graphite layer 102 and the heat insulation layer 103 to produce a composite sheet 106, bounding and combining can be performed based on melting a resin (the surface of the nonwoven fabric) of the heat insulation layer 103, followed by cooling the resin, without using any binding or adhesive agent.

In addition, as to an electronic apparatus including a heat-generating component, a heat insulation material and a housing storing these components, when the composite sheet 106 is used as the heat insulation material, heat transmission from the heat-generating component 105 to the housing 110 can effectively be reduced.

<Temperature of the Housing 110>

When the composite sheet 106 in which the heat insulation layer 103 and the graphite layer 102 are combined with each other is adhered to the inner surface of the housing 110, the temperature of the housing 110 can be significantly reduced.

This is because the heat transmission from the heat-generating component 105 is spread through the graphite layer 102, thereby reducing local temperatures, and the heat transmission is suppressed as much as possible through the heat insulation layer 103 (FIG. 6).

Furthermore, this is because, in FIGS. 7 and 8, as the remaining heat that has passed through the heat insulation layer 103 is further diffused through second or subsequent graphite layers 102 having higher heat conductivities in the surface direction, almost no heat is conveyed to the housing 110. The interlayer structure is the same as the above-mentioned structure.

There are actual cases where any measure to prevent excessive heat from transmitting to the housing is required for prevention of low-temperature burn injuries by smartphones or tablets. Use of the composite sheet according to the present embodiments for reducing heat transmission from a heat-generating component to the housing can satisfy such a requirement.

<Temperature of the Heat-Generating Component 105>

The temperature of the heat-generating component 105 itself can also be reduced by using the composite sheet 106 according to the present embodiment. This is a consequence of achievement of cooling effects due to heat diffusion through the graphite layer 102, and the cooling effects will be increased as the distance between the heat-generating component 105 and the graphite layer 102 becomes smaller. In other words, the composite sheet 106 according to the present embodiment is useful even when it is required that even the temperature of the heat-generating component 105 itself be kept lower.

Additional Feature

The above embodiments can be combined.

The composite sheet can be used inside a wide variety of electronic apparatuses. The composite sheet will be applied to products associated with heat, such as information apparatuses, portable apparatuses, and displays.

What is claimed is:

1. A composite sheet, comprising:
   a graphite layer;
   a heat insulation layer including a resin-based fiber and a heat insulation material; and
   a binding portion connecting with the resin-based fiber and combining the graphite layer and the heat insulation layer directly,
   wherein the binding portion and the heat insulating layer comprise the same resin-based fiber, and
   a recessed portion filled with the binding portion is provided on a surface of the graphite layer,
   wherein the binding portion includes a molten layer, wherein a portion of the resin-based fiber of the binding portion fills the recessed portion.

2. The composite sheet according to claim 1, wherein the resin-based fiber and the binding portion are integrated.

3. The composite sheet according to claim 1, wherein the resin-based fiber is a nonwoven fabric.

4. The composite sheet according to claim 1, wherein the resin-based fiber has a diameter of 0.1 to 30 µm and a bulk density of 0.5 g/m$^3$ or less.

5. The composite sheet according to claim 1, wherein the heat insulation material comprises silica aerogel.

6. The composite sheet according to claim 1, wherein the graphite layer is obtained by heat-treating film.

7. The composite sheet according to claim 1, wherein the graphite layer has a thickness of 0.1 mm or less, a heat conductivity in a surface direction of 1,000 W/m·K or more, and a heat conductivity in a thickness direction of 20 W/m·K or less; and the heat insulation layer has a thickness within a range of 0.05 mm to 1 mm, and a heat conductivity within a range of 0.01 to 0.1 W/m·K.

8. The composite sheet according to claim 1, further comprising:
   a second graphite layer that is located on a surface of the heat insulation layer, the surface being opposite to the surface on which the graphite layer is located; and
   a second binding portion located between the second graphite layer and the heat insulation layer, wherein the second binding portion comprises the resin-based fiber.

9. The composite sheet according to claim 1, further comprising insulation films on both surfaces of the composite sheet.

10. An electronic apparatus, comprising:
    an electronic component that generates heat;
    a housing; and
    the composite sheet according to claim 1, wherein the composite sheet is placed between the electronic component and the housing.

11. The composite sheet according to claim 1, wherein the partly melted fiber is the resin-based fiber heated to a temperature lower than a temperature where melting occurs.

12. The composite sheet according to claim 1, wherein the partly melted fiber is a portion of the resin-based fiber that has not become completely molten.

13. The composite sheet according to claim 1, wherein the partly melted fiber is linked to the resin-based fiber in the heat insulation layer.

14. The composite sheet according to claim 1, wherein the portion of the resin-based fiber of the binding portion which fills the recessed portion is a tip portion of the resin-based fiber.

15. The composite sheet according to claim 1, wherein the portion of the resin-based fiber of the binding portion which fills the recessed portion is a curve portion of the resin-based fiber.

16. The composite sheet according to claim 1, wherein the binding portion exists in chunks between the graphite layer and the heat insulation layer.

17. A method of producing a composite sheet, the composite sheet comprising:
    a graphite layer;
    a heat insulation layer including a resin-based fiber and a heat insulation material; and
    a binding portion connecting with the resin-based fiber and combining the graphite layer and the heat insulation layer directly,
    wherein the binding portion and the heat insulating layer comprise the same resin-based fiber, and a recessed portion filled with the binding portion is provided on a surface of the graphite layer, wherein the binding portion includes a molten layer, wherein a portion of the resin-based fiber of the binding portion fills the recessed portion, the method comprising:

overlapping the graphite layer and the heat insulation layer;

then heating a side of the graphite layer to melt the fiber in the heat insulation layer that is present in a boundary face between the graphite layer and the heat insulation layer; and cooling the fiber to laminate the graphite layer and the heat insulation layer.

* * * * *